(12) United States Patent
Ehm et al.

(10) Patent No.: US 10,073,361 B2
(45) Date of Patent: Sep. 11, 2018

(54) EUV LITHOGRAPHY SYSTEM AND OPERATING METHOD

(71) Applicants: Carl Zeiss SMT GmbH, Oberkochen (DE); ASML NETHERLANDS B.V., Veldhoven (NL)

(72) Inventors: Dirk Heinrich Ehm, Beckingen (DE); Stefan-Wolfgang Schmidt, Mettlach (DE); Edgar Osorio, Veldhoven (NL); Edwin Te Sligte, Eindhoven (NL); Mark Zellenrath, Veldhoven (NL); Hella Logtenberg, Eindhoven (NL)

(73) Assignees: Carl Zeiss SMT GmbH, Oberkochen (DE); ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/483,607

(22) Filed: Apr. 10, 2017

(65) Prior Publication Data

US 2017/0212433 A1 Jul. 27, 2017

Related U.S. Application Data

(63) Continuation of application No. PCT/EP2015/072600, filed on Sep. 30, 2015.

(30) Foreign Application Priority Data

Oct. 8, 2014 (DE) .................. 10 2014 114 572

(51) Int. Cl.
*G03B 27/52* (2006.01)
*G03F 7/20* (2006.01)

(52) U.S. Cl.
CPC ...... *G03F 7/70883* (2013.01); *G03F 7/70033* (2013.01); *G03F 7/70341* (2013.01)

(58) Field of Classification Search
CPC .................. G03F 7/70341; G03F 7/70883
(Continued)

(56) References Cited

U.S. PATENT DOCUMENTS 8,382,301 B2 * 2/2013 Ehm ............... B82Y 10/00
359/850
2002/0084425 A1 7/2002 Klebanoff et al.
(Continued)

FOREIGN PATENT DOCUMENTS

DE 10209493 A1 10/2003
DE 102005032320 A1 1/2007
(Continued)

OTHER PUBLICATIONS

Office Action in corresponding German Application , dated Sep. 6, 2015, along with English Translation.
(Continued)

*Primary Examiner* — Hung Henry Nguyen
(74) *Attorney, Agent, or Firm* — Edell, Shapiro & Finnan, LLC

(57) ABSTRACT

An EUV lithography system (1) includes: at least one optical element (13, 14) having an optical surface (13a, 14a) arranged in a vacuum environment (17) of the EUV lithography system (1), and a feed device (27) for feeding hydrogen into the vacuum environment (17), in which at least one silicon-containing surface (29a) is arranged. The feed device (27) additionally feeds an oxygen-containing gas into the vacuum environment (17) and has a metering device (28) that sets an oxygen partial pressure ($p_{O2}$) at the at least one silicon-containing surface (29a) and/or at the optical surface (13a, 14a).

15 Claims, 2 Drawing Sheets

(58) Field of Classification Search
USPC .................................................. 355/30, 53
See application file for complete search history.

(56) References Cited

U.S. PATENT DOCUMENTS

| | | | |
|---|---|---|---|
| 2005/0057734 A1* | 3/2005 | Stevens | B08B 7/0035 355/30 |
| 2005/0104015 A1 | 5/2005 | Wedowski et al. | |
| 2007/0054497 A1* | 3/2007 | Weiss | G03F 7/70916 438/758 |
| 2009/0231707 A1 | 9/2009 | Ehm et al. | |
| 2012/0224153 A1 | 9/2012 | Ehm et al. | |
| 2012/0250144 A1 | 10/2012 | Ehm et al. | |
| 2012/0295205 A1 | 11/2012 | Kempen et al. | |
| 2014/0211178 A1 | 7/2014 | Ehm et al. | |
| 2014/0261568 A1* | 9/2014 | Delgado | B08B 5/02 134/30 |

FOREIGN PATENT DOCUMENTS

| | | |
|---|---|---|
| DE | 102006044591 A1 | 4/2008 |
| DE | 102009001488 A1 | 11/2009 |
| DE | 102009029282 A1 | 3/2011 |
| DE | 102009045170 A1 | 4/2011 |
| DE | 102011083461 A1 | 3/2013 |
| DE | 102012213927 A1 | 6/2013 |
| WO | 2004099878 A2 | 11/2004 |
| WO | 2004104707 A2 | 12/2004 |
| WO | 2008034582 A2 | 3/2008 |
| WO | 2009032055 A1 | 3/2009 |

OTHER PUBLICATIONS

International Search Report and Written Opinion in counterpart International Application No. PCT/EP2015/072600, received Apr. 25, 2017, # pages.

Veprek, Stan et al., "Role of oxygen impurities in etching of silicon by atomic hydrogen^a", AVS: Science & Technology of Materials, Interfaces, and Processing, Mar. 2008, pp. 313-320.

* cited by examiner

EUV LITHOGRAPHY SYSTEM AND OPERATING METHOD

CROSS REFERENCE TO RELATED APPLICATION

This is a Continuation of International Application PCT/EP2015/072600 which has an international filing date of Sep. 30, 2015, and the disclosure of which is incorporated in its entirety into the present Continuation by reference. The following disclosure is also based on and claims the benefit of and priority under 35 U.S.C. § 119(a) to German Patent Application No. DE 10 2014 114 572.0, filed Oct. 8, 2014, which is also incorporated in its entirety into the present Continuation by reference.

FIELD OF THE INVENTION

The invention relates to an EUV lithography system comprising: at least one optical element having an optical surface arranged in a vacuum environment of the EUV lithography system, and a feed device for feeding hydrogen into the vacuum environment. The invention also relates to a method for operating an EUV lithography system.

BACKGROUND

Within the meaning of this application, an EUV lithography system is understood to be an optical system for extreme-ultraviolet (EUV) lithography, that is to say an optical system which can be used in the field of EUV lithography. Alongside an EUV lithography apparatus which serves for producing semiconductor components, the optical system can be, for example, an inspection system for inspecting a photomask (also called reticle hereinafter) used in an EUV lithography apparatus, for inspecting a semiconductor substrate (also called wafer hereinafter) to be patterned, or a metrology system used for measuring an EUV lithography apparatus or parts thereof, for example for measuring a projection system. In such an EUV lithography system, typically reflective optical elements, for example reflective multilayer mirrors, are arranged in a vacuum environment in one or a plurality of housings or vacuum chambers.

WO 2004/104707 A2 has disclosed an apparatus and a method for cleaning at least one optical component wherein a reaction partner, which is substantially transparent to the radiation of an EUV radiation source, depending on the prevailing reaction conditions, is admitted into a vacuum chamber via a feed device in order to chemically react with contaminating deposits for the purpose of eliminating the latter from the optical component. The reaction partner can be a hydrogen-containing substance that forms a volatile reaction product with the deposits under the prevailing reaction conditions. With the exception of the optical components, the remaining constituents in a vacuum chamber can be chemically passivated by the local addition of additional reaction gases, e.g. oxygen or hydrogen, or volatile substances can be converted into non-volatile substances. The reaction partner e.g. in the form of molecular hydrogen can be converted into radicals by the radiation of the EUV radiation source or by irradiation with an additional excitation device in order to intensify the cleaning effect.

In an EUV lithography system, hydrogen can be used in molecular form also as a purge gas or as an inert gas. In this regard, for example, WO 2008/034582 A2 in the name of the applicant discloses performing a local encapsulation of components at risk of contamination, in particular optical surfaces, of an EUV lithography system into partial housings having delimited partial volumes (mini-environments), which are purged with a purge gas, e.g. with hydrogen, in order to make it more difficult for contaminating substances to enter from the surroundings of the partial housing. Particles released within the mini-environment are intended to be entrained with the purge gas flow and transported into the surroundings via an outlet. However, the hydrogen used as a purge gas is also exposed to the EUV radiation and can be converted into radicals and in particular ionized if the EUV radiation has a sufficient energy.

Ionized hydrogen together with further ionized species and with electrons forms a plasma in the residual gas atmosphere of the EUV lithography system, which is referred to as hydrogen plasma hereinafter. The plasma density and the energy of the hydrogen ions or of the hydrogen radicals increase as the power of the EUV radiation increases. Alongside the positive effects discussed further above as a result of the cleaning action of the hydrogen plasma with regard to carbon or hydrocarbon contaminations, the hydrogen plasma generated by the EUV radiation also has negative effects.

A hydrogen plasma reacts for example upon contact with components which are arranged in the vacuum environment and which comprise specific critical materials, in particular metals such as tin or zinc, to form readily volatile hydrogen or hydride compounds or hydride complexes (hereinafter: hydrides) that are outgassed into the vacuum environment. The outgassed hydrides can deposit as contaminating substances on the optical surfaces of optical elements and react with the materials present there to form chemical compounds of low volatility such as e.g. metal alloys. The formation of the hydrides is a chemical reaction below a threshold value at which physical erosion (as a result of sputtering) commences.

The contaminating substances outgassed on account of the hydrogen plasma and deposited on the optical surfaces are generally far more difficult to remove from the optical surfaces than other contaminants that typically occur, e.g. in the form of hydrocarbon compounds. The optical elements typically at least partly lose their functionality on account of the deposits in the form of hydrides. In particular, the reflectivity of the optical elements can decrease, as a result of which the throughput of the EUV lithography system, in particular of an EUV lithography apparatus, decreases.

SUMMARY

It is an object of the invention to provide an EUV lithography system and a method for operating it wherein the deposition of contaminating substances, in particular of hydrides, on the optical surface of at least one optical element is reduced.

This object is achieved with an EUV lithography system of the type mentioned in the introduction wherein at least one silicon-containing surface, i.e. a surface composed of a silicon-containing material, is arranged in the vacuum environment, wherein the feed device is designed for additionally feeding an oxygen-containing gas into the vacuum environment, and wherein the feed device has a metering device for setting an oxygen partial pressure at the at least one silicon-containing surface and/or at the optical surface.

Alongside the metals described further above, silicon or silicon-containing compounds, for example $SiO_2$, are also materials which form a readily volatile hydride if they are exposed to a hydrogen plasma. The hydrides of silicon (silanes) or silicon itself can deposit on the optical surfaces of optical elements and form contaminations that are difficult to remove there.

In order to avoid the deposition of silicon-containing substances on the optical surfaces of optical elements arranged in the vacuum environment of the EUV lithography system, the invention proposes feeding oxygen in a low concentration to the vacuum environment. In a different context, namely during the etching treatment of silicon in a hydrogen plasma (cf. the article "Role of Oxygen Impurities in Etching of Silicon by Atomic Hydrogen", Stan Veprek et al., J. Vac. Sci. Technol. A, Vol. 26, No. 3, 2008), it was observed that the etching rate decreases when small amounts of oxygen (>10 ppm) are fed to the hydrogen plasma, and, above a specific oxygen concentration (>70 ppm), silicon is no longer etched in the hydrogen plasma. According to the article, this is attributable to the fact that a passivating layer composed of silicon oxide ($SiO_x$ or $SiO_2$) forms at the surface of the silicon and the chemical etching of said passivating layer by a hydrogen plasma is only possible at very high temperatures of more than approximately 1200° C.

For feeding the oxygen into the vacuum environment, the feed device has a metering device in order to set the concentration of oxygen or the oxygen partial pressure at the surface comprising the silicon-containing material and/or at the optical surface to a predefined value, in particular to a predefined interval between a minimum value and a maximum value within which the oxygen partial pressure should remain.

It has been found that as the oxygen partial pressure increases at the surface comprising the silicon-containing material, the etching rate as a result of the hydrogen plasma and thus the formation of silicon compounds decrease, that is to say that as the oxygen partial pressure increases, less and less silane is released into the vacuum environment. By adding a sufficient amount of oxygen into the vacuum environment both in the region of silicon-containing surfaces and in the region of optical surfaces, it is possible to effectively counteract the deposition of silanes or of silicon compounds of low volatility on optical surfaces.

However, the oxygen partial pressure in the vacuum environment must not be chosen to be excessively high, in order to avoid oxidation of materials arranged in the vacuum environment. By way of example, the oxygen can oxidize a capping layer provided at the optical surface and serving to protect a reflective multilayer system of the optical element. Oxidation of the multilayer system or of individual layers of the multilayer system is also possible. Suitable values for the oxygen partial pressure in the vacuum environment, to put it more precisely at the silicon-containing surface and/or at the optical surface, are therefore typically restricted to a comparatively small process window within which, on the one hand, the deposition of silicon compounds on the optical surface can be effectively reduced and, on the other hand, the oxidation of the optical surface or of a capping layer possibly present there can substantially be avoided.

The metering device serves to feed to the feed device the oxygen with a volumetric flow rate or with a flow rate (e.g. in mbar l/s) chosen such that the desired value of the oxygen partial pressure or a value within a predefined interval or process window at the respective surface is obtained. In this case, it is possible to make use of the fact that, in an EUV lithography system, after a certain operating duration after evacuation a dynamic equilibrium or a steady state is established in which the flow rates and the partial pressures of the gases present in the vacuum environment are substantially constant over time.

The partial pressures of the gases present in the vacuum environment are typically not of the same magnitude at all locations in the EUV lithography system, but rather have location-dependent gradients. These gradients are taken into account by the metering device in order to set the desired oxygen partial pressure or partial pressure range at the silicon-containing surface and/or at the optical surface. The metering device can perform open-loop control of the oxygen flow rate via corresponding valves if the gradients or the partial pressures at different locations in the EUV lithography system are known e.g. on the basis of vacuum simulations. However, it is also possible to measure the oxygen partial pressure in the region of the respective surfaces with the aid of sensors and to use the measured value in the metering device for closed-loop control of the oxygen partial pressure.

Ideally, the oxygen partial pressure both at the silicon-containing surface and at the optical surface is set with the aid of the metering device. Particularly if the optical surface and the silicon-containing surface are not spaced apart too far from one another, for example if they are arranged in a common vacuum chamber, it can be sufficient to feed the oxygen both to the silicon-containing surface and to the optical surface via a single feed line or via a single exit opening since the oxygen partial pressure at the respective surfaces differs only slightly in this case.

In one embodiment, the metering device is designed for setting an oxygen partial pressure of more than $5\times10^{-6}$ mbar, preferably of more than $9\times10^{-6}$ mbar, at the silicon-containing surface and/or at the optical surface. An oxygen partial pressure of more than $5\times10^{-6}$ mbar already enables a significant reduction of the deposition of silicon compounds on the optical surface, and an oxygen partial pressure of $9\times10^{-6}$ mbar can reduce the deposition of silicon compounds on the optical surface possibly by an order of magnitude.

In a further embodiment, the metering device is designed for setting an oxygen partial pressure of less than $2\times10^{-5}$ mbar, preferably of less than $5\times10^{-5}$ mbar, at the silicon-containing surface and/or at the optical surface. As was described further above, the oxygen partial pressure particularly at the optical surface must not be excessively high, in order to prevent oxidation of the material present at the optical surface. If the oxygen in a species that adsorbs to a relatively great extent on the optical surface, such as e.g. water, is introduced into the vacuum environment, it typically has a more highly oxidizing effect than is the case if the oxygen in a species that adsorbs weakly on the optical surface or desorbs to a relatively great extent, for example in the form of molecular oxygen, is fed to the vacuum environment. In the latter case, the hydrogen partial pressure can therefore typically be chosen to be greater, e.g. up to $5\times10^{-5}$ mbar, than in the former case, in which the oxygen partial pressure at least at the optical surface should usually be lower by at least one order of magnitude. Since the optical surface is arranged jointly with the silicon-containing surface in the vacuum environment, an oxygen partial pressure at the silicon-containing surface often leads to a similar oxygen partial pressure at the optical surface.

In a further embodiment, the oxygen-containing gas is selected from the group comprising: oxygen, water, (purified) air and mixtures thereof. Oxygen can be introduced in molecular form into the vacuum environment, but it is also possible to provide the oxygen in a mixture of a plurality of gases, for example in the form of purified air, into the vacuum environment. The purified air can be air suitable as a purge gas e.g. for EUV lithography systems, for example so-called "extreme clean dry air", XCDA. In this case, the purified air possibly present anyway as a purge gas e.g. for purging the environment of a mask can be fed to the vacuum environment of the EUV lithography apparatus at a suitable location. The oxygen can also be present in the form of a chemical compound in the gas fed to the vacuum environment; for example, the oxygen-containing gas can be water ($H_2O$).

In one development, the silicon-containing surface is formed at a substrate of the (reflective) optical element. On account of the extremely stringent requirements made of geometrical tolerances and stability, substrate materials for optical elements for EUV lithography systems typically have a very low coefficient of thermal expansion (CTE). A first material group that satisfies the stringent requirements regarding the CTE is doped silicate glasses, e.g. silicate or quartz glass doped with titanium dioxide. One such silicate glass that is commercially available is sold by Corning Inc. under the trade name ULE® (Ultra Low Expansion glass). A second material group suitable as substrates for EUV mirrors is glass ceramics in which the ratio of the crystal phase to the ($SiO_2$-containing) glass phase is set in such a way that the coefficients of thermal expansion of the different phases almost cancel one another out in a specific temperature range. Such glass ceramics are offered e.g. by Schott AG under the trade name Zerodur® or by Ohara Inc. under the trade name Clearceram®. The substrates typically used for the production of optical elements for use in EUV lithography thus typically contain silicon in the form of a silicon compound, typically in the form of $SiO_2$.

The substrate of a reflective optical element typically has a circumferential side surface and a region at the front side and at the rear side which are not coated at least in a partial region and therefore form an interface with the vacuum environment, such that silanes can be formed by contact with a hydrogen plasma present there. In this case, the optical surface on which the silanes can deposit is arranged on the coated top side of the substrate and thus in direct proximity to the silicon-containing surface. Generally, it is therefore sufficient in this case if the oxygen-containing gas is fed to both surfaces via a common feed line or exit opening since, in this case, the oxygen partial pressure at the two surfaces generally differs only slightly.

If appropriate, the optical surface of the optical element and the silicon-containing surface can be one and the same surface. In this case, the optical surface of the optical element is formed from a silicon-containing material. This can be the case, for example, if the optical element has a coating, the capping layer of which contains a silicon-containing material, for example silicon nitride or $SiO_2$, or consists of said material. Generally, however, the silicon-containing surface forms a (further) surface that does not correspond to the optical surface.

In one further embodiment, the silicon-containing surface is formed at a component that is not arranged in the EUV beam path. The component is therefore not an optical element for the reflection of EUV radiation. The component can be, for example, an inspection window of a sensor that separates the sensor area, e.g. in the form of a CCD chip, from the vacuum environment. Other components which have a surface containing silicon (not necessarily in the form of $SiO_2$) and for which the formation of silanes can be suppressed by the generation of a sufficiently high oxygen partial pressure can also be arranged in the vacuum environment.

In a further embodiment, the feed device has an exit opening that is arranged and aligned to allow the oxygen-containing gas to emerge along a line of sight to the at least one silicon-containing surface and/or to the optical surface. In this case, the normal direction running through the middle or centre of the exit opening intersects the silicon-containing surface and/or the optical surface. In this way, the oxygen-containing gas can be applied purposefully to the respective surface in an aligned manner. In this way, a comparatively low flow rate is required for generating the desired oxygen partial pressure and an increased oxygen partial pressure in comparison with the environment can be applied purposefully to the respective surface. The exit opening need not necessarily be arranged along a line of sight with the optical surface and/or with the silicon-containing surface since in this case as well generally the desired oxygen partial pressure can be attained at the respective surface.

In a further embodiment, the feed device is designed to allow the hydrogen and the oxygen-containing gas to emerge via an exit opening of a common feed line into the vacuum environment. This is advantageous particularly for the case where an exit opening for feeding hydrogen into the vacuum environment is already present anyway, for example in order to use the hydrogen as a purge gas. In this case, the exit opening for the hydrogen can be aligned along a line of sight to the optical surface, such that the latter can also be used for feeding the oxygen-containing gas to the silicon-containing surface, particularly if the latter is formed at the optical element itself.

In a further embodiment, the optical element is arranged in a vacuum chamber arranged in an interior of a housing, wherein the vacuum chamber has an outlet that connects the vacuum chamber to the interior. In the vacuum chamber, a so-called "mini-environment" can be generated, in which the partial pressure of contaminating substances at least directly at the optical surface is lower than the partial pressure of contaminating substances in the interior of the housing in which the vacuum chamber is arranged, as is described for example in WO 2008/034582 A2 cited in the introduction, which is incorporated by reference in the content of this application.

In order to achieve the reduction of the partial pressure of the contaminating substances, a purge device can be provided, which purges at least one partial region of the vacuum chamber with a purge gas, for example with hydrogen. The purge gas introduced into the vacuum chamber emerges from the vacuum chamber via the outlet, which can be embodied for example in the form of a tubular channel, and enters the interior of the housing. Typically, for generating the purge gas flow from the interior of the vacuum chamber in the interior of the housing there prevails a lower total pressure than in the vacuum chamber in which the at least one optical element is arranged.

The housing in which the vacuum chamber is arranged can be, in particular, a beam generating system, an illumination system or a projection system of an EUV lithography system in the form of an EUV lithography apparatus. Typically, in the case of an EUV lithography apparatus, the beam path of the EUV radiation runs substantially completely within a plurality of interconnected vacuum housings that is to say that substantially the entire beam path of the EUV radiation is encapsulated in a plurality of interconnected "mini environments" and is separated in a gas-tight manner relative to the housing or relative to individual housing parts, disregarding the outlet or outlets through which the purge gas can emerge from the vacuum chamber or vacuum chambers forming the respective "mini environment" into the interior.

In one development, the feed device has an exit opening that is arranged in the vacuum chamber in order to allow the oxygen-containing gas and a purge gas, in particular hydrogen, to emerge into the vacuum environment of the vacuum chamber. In this case, the oxygen-containing gas is conducted jointly with the purge gas, typically hydrogen, into the vacuum chamber, in which at least one silicon-containing surface is typically arranged in addition to the optical surface.

In a further embodiment, the feed device has a feed line having an exit opening in order to feed the oxygen-containing gas to the interior of the housing. In this case, the oxygen-containing gas is introduced into the housing outside the vacuum chamber(s) encapsulating the beam path of the EUV radiation. This makes it possible to act directly on silicon-containing surfaces possibly present in the interior and to set a desired oxygen partial pressure at said silicon-containing surfaces. Although the outlet or outlets of the vacuum chambers for generating the purge gas flow into the interior is or are typically embodied in such a way that the diffusion of contaminating and other substances from the interior into the vacuum chamber, i.e. counter to the flow of the purge gas, is avoided, this is generally not possible completely. By feeding the oxygen-containing gas into the interior of the housing, it is therefore also possible, if appropriate, to set the desired oxygen partial pressure at the optical surface of the optical element arranged in the vacuum chamber. In order to suitably set the flow rate of the oxygen into the interior of the vacuum chamber, the diffusion rate of the oxygen into the interior of the vacuum chamber can be determined or the oxygen partial pressure established at a specific flow rate in the steady state (dynamic equilibrium) can be measured at the optical surface.

In a further embodiment, the feed device is designed to feed the oxygen-containing gas and a purge gas, in particular hydrogen, to a tubular channel between a first housing and a second housing of the EUV lithography system. The two housings can be, for example, the housings of the illumination system and of the beam generating system described further above or e.g. a housing in which a wafer is arranged and the projection system, or a housing in which a mask is arranged, which housing is connected to the illumination system or to the projection system via a tubular channel. The tubular channel can in particular also be formed between two vacuum chambers that serve for encapsulating the EUV beam path and are accommodated in the interiors of different housings or housing parts.

The tubular channel typically serves the purpose of generating a transverse flow of a purge gas in order to prevent the penetration of contaminating substances from the first housing or the first vacuum chamber into the second housing or into the second vacuum chamber (and vice versa). A collecting opening for collecting the purge gas can be formed in the tubular channel. In general, however, the purge gas cannot be completely collected by the collecting opening, and so part of the purge gas and thus also of the oxygen-containing gas passes into the first and/or second housing or into the first and/or second vacuum chamber and, at optical surfaces and/or silicon-containing surfaces provided there, generates an oxygen partial pressure lying within the desired process window.

A further aspect of the invention relates to a method for operating an EUV lithography system, comprising: feeding hydrogen and an oxygen-containing gas into a vacuum environment in which at least one optical element having an optical surface and at least one silicon-containing surface is arranged, and setting an oxygen partial pressure at the at least one silicon-containing surface and/or at the optical surface. The oxygen partial pressure is typically set to a value that lies within a predefined interval or process window, i.e. between a maximum and a minimum oxygen partial pressure. The oxygen partial pressure relates to normal operation of the EUV lithography system, i.e. the oxygen partial pressure that prevails at the respective surface if a dynamic equilibrium or a steady state of operation has been established in the EUV lithography system. In an EUV lithography apparatus, normal operation is exposure operation, in which a light-sensitive substrate (wafer) is exposed.

In one variant of the method, the oxygen partial pressure is set to a value of more than $5 \times 10^{-6}$ mbar, preferably of more than $9 \times 10^{-6}$ mbar, at the silicon-containing surface and/or at the optical surface. As was described further above, even comparatively low oxygen partial pressure at a silicon-containing surface leads to a significant reduction of the formation of silanes.

In a further development, the oxygen partial pressure is set to a value of less than $2 \times 10^{-5}$ mbar, preferably less than $5 \times 10^{-5}$ mbar, at the silicon-containing surface and/or at the optical surface. As was explained further above, the oxygen partial pressure particularly at the optical surface but also at other surfaces arranged in the vacuum environment should be chosen not to be excessively high, in order to prevent oxidation of the materials present there. Particularly if the oxygen is fed in a form that does not oxidize to an excessively great extent or a form that does not adsorb to an excessively great extent on the optical surface, it is possible, if appropriate, to increase the oxygen partial pressure to a value of more than $2 \times 10^{-5}$ mbar, but the oxygen partial pressure should nevertheless be less than $5 \times 10^{-5}$ mbar.

The oxygen-containing gas can be fed, in particular, in the manner described further above in association with the EUV lithography system. In particular, the oxygen-containing gas can be fed locally to the optical surface and/or to the silicon-containing surface, that is to say that an exit opening for feeding the oxygen-containing gas can be arranged in proximity to a respective surface.

Further features and advantages of the invention are evident from the following description of exemplary embodiments of the invention, with reference to the figures of the drawing, which show details essential to the invention, and from the claims. The individual features can be realised in each case individually by themselves or as a plurality in any desired combination in a variant of the invention.

BRIEF DESCRIPTION OF THE DRAWINGS

Exemplary embodiments are illustrated in the schematic drawing and are explained in the description below. In the figures.

In the following description of the drawings, identical reference signs are used for identical or functionally identical structural parts.

DETAILED DESCRIPTION

Figure 1A:
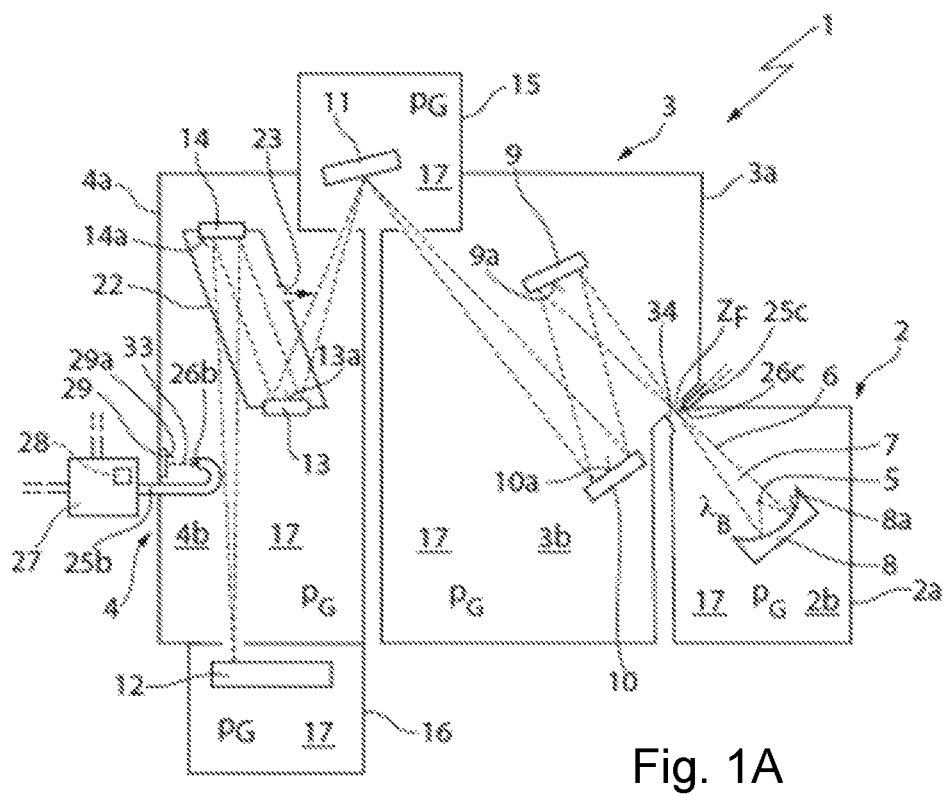
FIG. 1A shows a schematic illustration of an EUV lithography apparatus comprising a plurality of optical elements arranged in a vacuum environment.

FIG. 1A schematically shows an EUV lithography system 1 in the form of an EUV lithography apparatus, comprising a beam generating system 2, an illumination system 3 and a projection system 4, which are accommodated in separate housings 2a, 3a, 4a and arranged successively in a beam path 6 of the EUV radiation 7 generated by an EUV light source 5 of the beam generating system 2, said beam path proceeding from the EUV light source 5.

A plasma source or a synchrotron, for example, can serve as the EUV light source 5. The radiation emerging from the light source 5, said radiation having an intensity maximum at an operating wavelength $\lambda_B$, said intensity maximum being approximately 13.5 nm in the present example, is focused with the aid of a collimator mirror 8 in order to further increase the energy density. The EUV radiation 7 treated with regard to its spatial distribution in the beam generating system 2 is introduced into the illumination system 3, comprising a first and second reflective optical element 9, 10. The two reflective optical elements 9, 10 direct the radiation onto a photomask 11 (reticle) as further reflective optical element, which has a structure that is imaged onto a wafer 12 on a reduced scale using the projection system 4. For this purpose, a first and second reflective optical element 13, 14 are provided in the projection system 4. The mask 11 is arranged in a vacuum housing 15 connected to the illumination system 3 and the projection system 4 via passage openings for the passage of the EUV beam path 6. The wafer 12, too, is accommodated in a dedicated housing 16 connected to the projection system 4. Both the number of optical elements in the individual systems 2, 3, 4 and the arrangement thereof should be understood to be merely by way of example, and that both the number and the arrangement of the optical elements can differ from the EUV lithography apparatus 1 shown in FIG. 1 in an actual EUV lithography apparatus 1.

The reflective optical elements 8, 9, 10, 11, 13, 14 respectively have an optical surface 8a, 9a, 10a, 11a, 13a, 14a that is exposed to the EUV radiation 7 of the light source 5. The reflective optical elements 8, 9, 10, 11, 13, 14 are arranged in a vacuum environment 17 of the EUV lithography apparatus 1, in which a total pressure $p_G$ of typically between approximately 0.001 mbar and approximately 1 mbar prevails. The total pressure $p_G$ is typically not spatially constant, but rather varies depending on the position in the EUV lithography apparatus 1, wherein a dynamic equilibrium or a steady state of the distribution of the total pressure $p_G$ in the EUV lithography apparatus 1 is established after a certain time period after the start-up of the EUV lithography system 1.

Figures 1B, 1C:
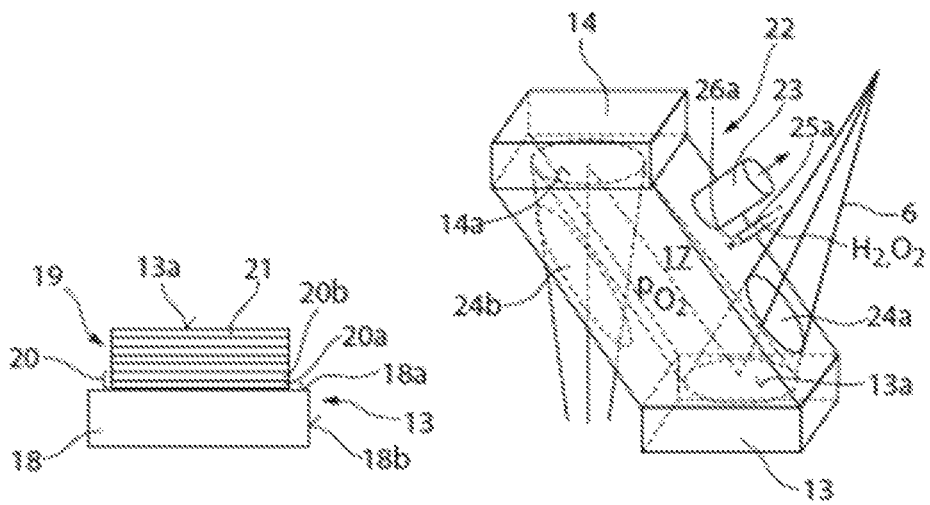
FIG. 1B shows a detail of an optical element having a reflective multilayer coating applied on a substrate.
FIG. 1C shows a detail of a vacuum chamber of the EUV lithography apparatus from FIG. 1A arranged in a housing of a projection system.

In the example shown, the reflective optical elements 8, 9, 10, 11, 13, 14 are in each case provided with a multilayer coating that is reflective for the EUV radiation 7. FIG. 1B shows by way of example the construction of the first optical element 13 in the projection system 4. The first optical element 13 has a substrate 18, which is formed from quartz glass (ULE®) doped with titanium dioxide in the example shown. The substrate 18 can alternatively also be formed from other materials having a particularly low coefficient of thermal expansion at the operating temperature of the optical element 13, for example from a glass ceramic such as e.g. Zerodur® etc.

A multilayer coating 19 that is reflective for the EUV radiation 7 is applied to the substrate 18, said multilayer coating having a number of layer pairs 20 comprising alternating layers composed of a high refractive index layer material 20a and a low refractive index layer material 20b. If EUV radiation 7 at an operating wavelength in the region of $\lambda_B$=13.5 nm is used, then the individual layers usually consist of molybdenum and silicon. Depending on the operating wavelength $\lambda_B$ used, other material combinations such as e.g. molybdenum and beryllium, ruthenium and beryllium or lanthanum and $B_4C$, are likewise possible. In addition to the individual layers, the reflective coating 19 generally has intermediate layers for preventing diffusion (so-called barrier layers). A capping layer 21 is applied at the top side of the reflective coating 19, and is intended to protect the underlying layer pairs 20 against oxidation or against corrosion, for example if the reflective optical element 13 is cleaned using a hydrogen plasma. The material of the capping layer 21 can be Ir, Rh, Ru, Pt, Pd, . . . , for example.

In the example shown, the first and second optical elements 13, 14 of the projection system 4 are accommodated in a common vacuum chamber 22 arranged in the interior 4b of the projection system 4. The vacuum chamber 22 is illustrated in detail in FIG. 1C and has an outlet 23 connecting the interior of the vacuum chamber 22 to the interior 4b of the housing 4a of the projection system 4. With the aid of the vacuum chamber 22 arranged in the interior 4b of the housing 4a, the beam path between the two optical elements 13, 14 is encapsulated, i.e. separated from the interior 4b of the housing 4a. The vacuum chamber 22 shown in FIG. 1C has a first opening 24a, via which the EUV beam path 6 or the EUV radiation 7 enters the vacuum chamber 22, and a second opening 24b, through which the EUV beam path 6 or the EUV radiation 7 leaves the vacuum chamber 22. In the example shown, the vacuum chamber 22 shown in FIGS. 1A and 1C is connected both at the first opening 24a and at the second opening 24b to a further vacuum chamber (not illustrated pictorially in FIG. 1A) in order to encapsulate substantially the entire EUV beam path 6 from the respective interiors 2b, 3b, 4b of the beam generating system 2, of the illumination system 3 and of the projection system 4.

In the case of the vacuum chamber 22 shown in FIG. 1C, a connection between the interior 4b of the housing 4a and the interior of the vacuum chamber 22 in which the EUV beam path 6 runs is thus not produced via the openings 24a, 24b, but rather only via the outlet 23. As can be discerned in FIG. 1C, an exit opening 26a of a feed line 25a for feeding a purge gas, in the form of hydrogen $H_2$ in the example shown, opens in the interior of the vacuum chamber 22. In addition, molecular oxygen $O_2$ is also introduced into the interior of the vacuum chamber 22 via the feed line 25a. The feed line 25a is connected to a central feed device 27, which provides both the hydrogen $H_2$ used as purge gas and the oxygen $O_2$. In the example shown, the feed device 27 has a metering device 28 in order to admix the oxygen $O_2$ having a predefined flow rate (mbar 1/s) with the hydrogen $H_2$ in order to attain or to set at the first optical element 13, to put it more precisely at the optical surface 13a thereof, a predefined oxygen partial pressure $p_{O2}$, which should typically lie in an interval between a minimum value $p_{O2,MIN}$ of $5 \times 10^{-6}$ mbar, preferably $9 \times 10^{-6}$ mbar, and a maximum value $p_{O2,MAX}$ of less than $2 \times 10^{-5}$ mbar.

In the example shown, the location-dependent variation of the oxygen partial pressure pot in the interior of the vacuum chamber 22 is low, such that the oxygen partial pressure $p_{O2}$ in the entire vacuum chamber 22 lies within the interval specified above. Consequently, an oxygen partial pressure $p_{O2}$ lying within the interval specified above prevails both at the optical surface 13a of the first optical element 13 and at the adjacent, silicon- or $SiO_2$-containing surfaces 18a, 18b of the first optical element 13. Correspondingly, an oxygen partial pressure $p_{O2}$ lying between the minimum value $p_{O2,MIN}$ specified above and the maximum value $p_{O2,MAX}$ specified above also prevails at the optical surface 14a of the second optical element 14 and at the surfaces of the substrate (not illustrated) thereof.

The hydrogen $H_2$ serving as purge gas and introduced into the interior of the vacuum chamber 22 and the oxygen $O_2$ enter the interior of the housing 4b of the projection system 4 via the outlet 23 and are extracted there via suction devices or vacuum pumps (not shown). The hydrogen $H_2$ is situated in the interior of the vacuum chamber 22 partly also within the EUV beam path 6 and is excited or ionized by the high-energy EUV radiation 7, such that said hydrogen is present at least partly in the form of a hydrogen plasma. The hydrogen $H_2$ in the form of the hydrogen plasma comes into contact with the silicon-containing surfaces 18a, 18b of the first and second optical elements 13, 14 and leads to chemical etching of the silicon, in the course of which readily volatile silanes are formed as reaction products.

Figure 2:
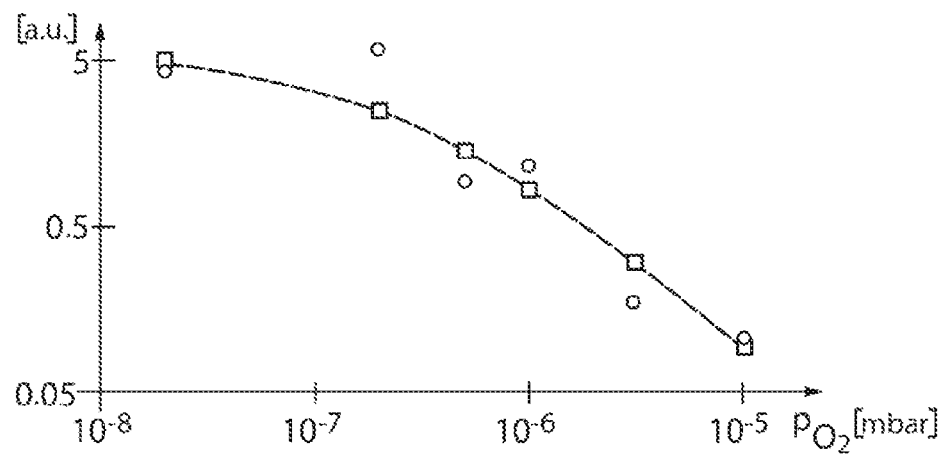
FIG. 2 shows a schematic illustration of an etching rate brought about by a hydrogen plasma at a silicon-containing surface as a function of the oxygen partial pressure at the surface.

As is shown in FIG. 2, as a result of the setting of an oxygen partial pressure $p_{O2}$ at the silicon-containing surfaces 18a, 18b, that is more than $5 \times 10^{-6}$ mbar, the formation of silane or the etching rate illustrated (in arbitrary units) in FIG. 2 at the silicon-containing surfaces 18a, 18b is reduced by an order of magnitude. In the case of a value of the oxygen partial pressure pot of more than $9 \times 10^{-6}$ mbar, the etching rate can be reduced by almost two orders of magnitude compared with a vacuum environment 17 in which practically no oxygen $O_2$ is present ($p_{O2} < 10^{-7}$ mbar).

Figure 3:
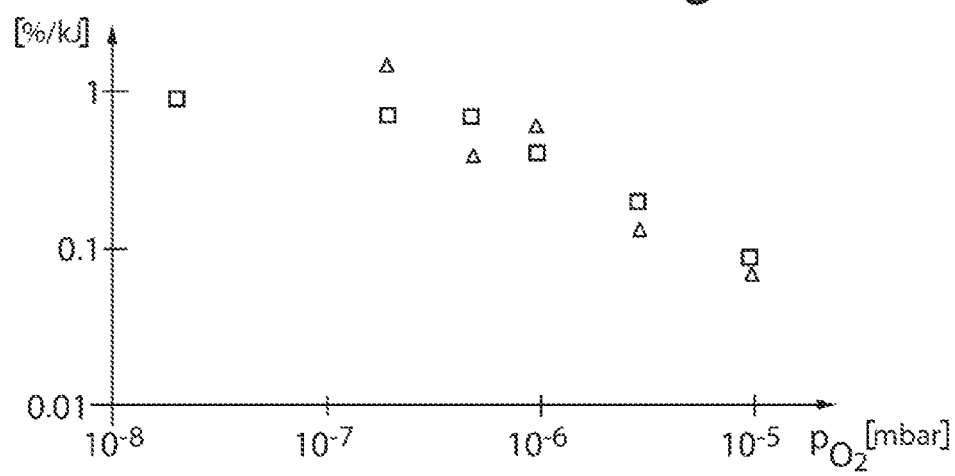
FIG. 3 shows a schematic illustration of a deposition rate of silicon compounds at an optical surface as a function of the oxygen partial pressure.

Since less silane is formed at the silicon-containing surfaces 18a, 18b on account of the oxygen $O_2$ present there, the deposition of silane (SiH) on the optical surface 13a, to put it more precisely on the material of the capping layer 21 present there, also decreases. The presence of oxygen $O_2$ at the optical surface 13a additionally contributes to only a very small proportion of silicon compounds depositing on the optical surface 13a, as can be discerned in FIG. 3. FIG. 3 shows the deposition rate of silicon compounds on the optical surface 13a, or, more precisely stated, the decrease in the reflectivity of the optical element 13 (in %) per incident EUV radiation dose (in kJ). By way of example, the illustration shown in FIG. 3 relates for instance to the reduction of the deposition by the reduction of silane formation at the silicon-containing surfaces such as e.g. the surfaces 18a, 18b.

Both FIG. 2 and FIG. 3 illustrate experimentally determined values and values resulting from a model of the flow relationships and/or the pressure relationships in the EUV lithography apparatus 1. The experimentally determined measurement values are illustrated as circles in FIG. 2, while the experimentally determined values are illustrated as triangles in FIG. 3. The values calculated from a model of the flow relationships in the EUV lithography apparatus 1 are illustrated as squares both in FIG. 2 and in FIG. 3. As can be discerned in FIG. 2 and in FIG. 3, the values of the model correspond well to the experimentally determined measurement values.

Figure 4:
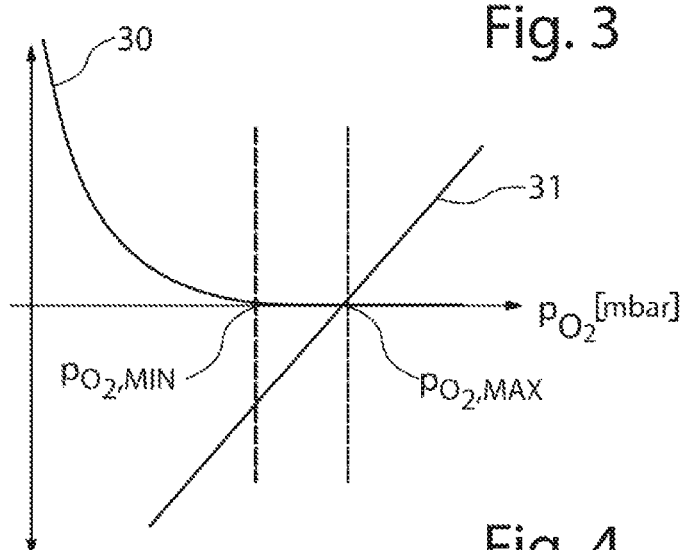
FIG. 4 shows a schematic illustration of a process window for the oxygen partial pressure at a silicon-containing surface and/or at an optical surface.

As can be discerned with reference to FIG. 4, it is advantageous if, on the one hand, the oxygen partial pressure $p_{O2}$ lies above a minimum value $P_{O2,MIN}$ at which the deposition of silicon compounds can be effectively suppressed, as is shown in FIG. 4 on the basis of a falling curve 30 illustrating the deposition rate of silicon compounds. On the other hand, the oxygen partial pressure $p_{O2}$ should also be chosen not to be excessively high, that is to say that said oxygen partial pressure should not exceed a maximum value $p_{O2,MAX}$ in order to prevent the oxidation rate of the material of the capping layer 21 or the deposition of silicon dioxide ($SiO_2$) on the optical surface 13a, which is illustrated by a straight line 31 in FIG. 4, from becoming excessively high. In the case of the example shown in FIG. 4, an oxidation of the capping layer 21 takes place in the range of the oxygen partial pressure $p_{O2}$ for which the straight line 31 runs above the horizontal axis, while a reduction of the capping layer 21 takes place at lower oxygen partial pressures $p_{O2} < p_{O2,MAX}$.

In the case of an excessively high oxygen partial pressure $p_{O2}$ at the optical surface 13a, firstly the material of the capping layer 21 can be oxidized, which is undesirable, and secondly the materials of the layer pairs 20 of the reflective multilayer coating 19 can be oxidized, which is likewise undesirable.

The oxygen $O_2$ can also be fed at locations other than in the vacuum chamber 22 of the EUV lithography apparatus 1. In the case of the example shown in FIG. 1A, the feed device 27 is also designed for feeding oxygen $O_2$ into the interior 4b of the housing 4a of the projection system 4 and for this purpose has a second feed line 25b having a second exit opening 26b positioned directly in front of a component 29 which is arranged in the vacuum environment 17 and which is not situated in the beam path 6 of the EUV radiation 7. The component 29 can be a quartz glass window, for example, which serves for protecting e.g. an optical sensor or some other structural part. The component 29 in the form of the quartz glass window likewise has a silicon-containing surface 29a which can come into contact with hydrogen that emerges e.g. via the outlet 23 of the vacuum chamber 22 into the interior 4b and, if appropriate, is still reactive or ionized.

As a result of the arrangement of the second exit opening 26b in front of the component 29 not positioned in the beam path 6 and as a result of the alignment of the normal direction of the second exit opening 26b perpendicular to the silicon-containing surface 29a, the oxygen $O_2$ can emerge along a line of sight 33 towards the component 29, that is to say that the oxygen $O_2$ emerging along the centre axis of the second exit opening 26b impinges along the line of sight 33 directly on the surface 29a of the component 29.

The first exit opening 26a of the first feed line 25a, which feeds the oxygen $O_2$ jointly with the hydrogen $H_2$ into the vacuum chamber 22, can be aligned with one of the two optical elements 13, 14 present there, such that the oxygen $O_2$ can emerge along a line of sight onto the respective optical surface 13a, 14a and/or onto the silicon-containing surfaces 18a, 18b of the substrate 18.

In the example shown, via the second exit opening 26b, molecular oxygen $O_2$ is applied to the surface 29a of the component 29 not arranged in the EUV beam path 6. A suitable oxygen partial pressure $p_{O2}$ at the surface 29a of the component 29 can also be generated if other oxygen-containing gases or gas mixtures are used, for example if the oxygen $O_2$ is contained in purified air provided by the feed device 27. Moreover, the oxygen $O_2$ can be introduced, if appropriate, in the form of a gaseous compound, for example in the form of water, into the vacuum environment 17. Depending on the form in which the oxygen $O_2$ is introduced into the vacuum environment 17, it may be necessary, if appropriate, to suitably adapt the interval limits $p_{O2,MIN}$ and $p_{O2,MAX}$, within which the partial pressure $p_{O2}$ of the oxygen $O_2$ is intended to be set.

Moreover, the oxygen $O_2$, if appropriate, can be introduced into the interior 4b of the housing 4a of the projection system 4 in order to achieve the desired oxygen partial pressure $p_{O2}$ within the vacuum chamber 22, i.e. at the two optical surfaces 13a, 14a of the optical elements 13, 14 and/or the silicon-containing surfaces 18a, 18b of the respective substrate 18 (provided that this is not carried out via the first feed line 25a shown in FIG. 1C). In this case, it is necessary for a sufficient amount of oxygen $O_2$ to pass counter to the flow direction of the purge gas through the outlet 23 into the interior of the vacuum chamber 22. For this purpose, it is typically necessary to generate a high pressure in the interior 4b of the housing 4a of the projection system 4 and/or a comparatively high flowrate of the oxygen $O_2$ fed, which is set with the aid of the metering device 29. Oxygen $O_2$ can also be introduced into the interior 3b of the housing 3a of the illumination system 3 and/or into the interior 2b of the housing 2a of the beam generating system 2.

In order to prevent tin and further contaminating substances from being transferred from the beam generating system 2 into the illumination system 3, a tubular channel 34 is formed—as can be discerned in FIG. 1A—between the two associated housings 2a, 3a, said channel having a conical geometry in the example shown. The geometry of the tubular channel 34 is adapted to the course of the beam path 6 of the EUV radiation 7 in the region between the two housings 2a, 3a which has an intermediate focus $z_F$ in the region of the entrance into the illumination system 3. Unlike in the illustration shown in FIG. 1, the tubular channel 34 encloses the beam path of the EUV radiation 7 at a small distance in order to minimize the cross-sectional area through which contaminated substances can possibly pass.

As can be discerned in FIG. 1, the feed device 27 has a third feed line 25c having a third exit opening 26c, via which a purge gas, for example in the form of hydrogen $H_2$, is fed laterally to the tubular channel 34. Part of the purge gas can be collected at a collecting opening (not illustrated pictorially) which is situated opposite the exit opening 26c and which is formed in the sidewall of the tubular channel 34 which separates the housing 2a of the beam generating system 2 from the housing 3a of the illumination system 3. Oxygen $O_2$ can be fed into the vacuum environment 17 also via the third feed line 25c or via the associated exit opening 26c, in order to generate an oxygen partial pressure $p_{O2}$ within the range specified further above at silicon-containing surfaces present in the vacuum environment 17 and/or at the optical surfaces of optical elements. In particular, the tubular channel 34 shown in FIG. 1A can be arranged between two vacuum chambers (not illustrated pictorially) which are arranged in the respective housings 2a, 3a and which, like the vacuum chamber 22 shown in FIG. 1C, serve to encapsulate the beam path 6 of the EUV radiation 7.

The metering device 28 takes into account both the type of gas with which the oxygen $O_2$ is fed to the vacuum environment 17 and the location at which it is fed, in order to generate the desired oxygen partial pressure $p_{O2}$ at the respective surfaces 13a, 14a, . . . , 18a, 18b. In this case, the metering device 28 can have recourse for example to information about the pressure distribution or to the pressure relationships within the EUV lithography apparatus 1 in the steady state (dynamic equilibrium), in order to suitably drive valves provided for setting the flowrate of the oxygen $O_2$. For this purpose, the metering device 28 can, if appropriate, also have recourse to information regarding the oxygen content or the oxygen partial pressure at specific positions within the EUV lithography apparatus 1 at which a gas sensor, for example in the form of a mass spectrometer, is arranged. In this case, the oxygen partial pressure $p_{O2}$ at a respective surface can be controlled by closed-loop control on the basis of the measured sensor data, such that said oxygen partial pressure remains within the desired process window.

In this manner described further above, the optical surfaces 8a, 9a, 10a, 11a, 13a, 14a of the EUV lithography apparatus 1 can be effectively protected against contaminations which are generated by silicon-containing surfaces 18a, 18b, 29a present in the vacuum environment 17 upon contact with activated hydrogen $H_2$ or with a hydrogen plasma.

What is claimed is:

1. A system for extreme ultraviolet (EUV) lithography, comprising:
   at least one optical element having an optical surface and at least one silicon-containing surface arranged in a vacuum environment of the EUV lithography system, and
   a feed device configured to feed hydrogen and an oxygen-containing gas into the vacuum environment,
   wherein the feed device comprises a metering device configured to feed the oxygen with a flow rate selected to set an oxygen partial pressure at the at least one silicon-containing surface and/or at the optical surface within a predefined interval between a maximum value and a minimum value,
   wherein the silicon-containing surface is positioned at a component that is not arranged in an EUV beam path of the EUV lithography system, and
   wherein the metering device is configured to set the oxygen partial pressure to more than $5\times10^{-6}$ mbar and less than $5\times10^{-5}$ mbar at the silicon-containing surface and/or at the optical surface.

2. The system according to claim 1, wherein the metering device is configured to set the oxygen partial pressure to less than $2\times10^{-5}$ mbar at the silicon-containing surface and/or at the optical surface.

3. The system according to claim 1, wherein the oxygen-containing gas is selected from the group consisting of: oxygen, water, air and mixtures thereof.

4. The system according to claim 1, wherein the feed device comprises a feed line having an exit opening arranged and aligned to allow the oxygen-containing gas to emerge along a line of sight to the at least one silicon-containing surface and/or to the optical surface.

5. The system according to claim 1, wherein the feed device is configured to allow the hydrogen and the oxygen-containing gas to emerge via an exit opening of a common feed line into the vacuum environment.

6. The system according to claim 1, wherein the optical element is arranged in a vacuum chamber arranged in an interior of a housing, and wherein the vacuum chamber has an outlet that connects the vacuum chamber to the interior.

7. The system according to claim 6, wherein the feed device has a feed line having an exit opening that is arranged in the vacuum chamber and is configured to feed the oxygen-containing gas and a purge gas into the vacuum environment of the vacuum chamber.

8. The system according to claim 6, wherein the feed device has a feed line having an exit opening and is configured to feed the oxygen-containing gas to the interior of the housing.

9. The system according to claim 1, wherein the feed device is configured to feed the oxygen-containing gas and a purge gas to a tubular channel between a first housing and a second housing of the EUV lithography system.

10. A method for operating an EUV lithography system, comprising:
feeding hydrogen and an oxygen-containing gas into a vacuum environment in which at least one optical element having an optical surface and at least one silicon-containing surface is arranged, and
setting an oxygen partial pressure at the at least one silicon-containing surface and/or at the optical surface;
wherein the silicon-containing surface is positioned at a component that is not arranged in an EUV beam path of the EUV lithography system, and
wherein the oxygen partial pressure is set to a value of more than $5 \times 10^{-6}$ mbar and less than $5 \times 10^{-5}$ mbar at the silicon-containing surface and/or at the optical surface.

11. The method according to claim 10, wherein the oxygen partial pressure is set to a value of less than $2 \times 10^{-5}$ mbar at the silicon-containing surface and/or at the optical surface.

12. The system according to claim 1, wherein the metering device is configured to set the oxygen partial pressure to more than $9 \times 10^{-6}$ mbar at the silicon-containing surface and/or at the optical surface.

13. The system according to claim 7, wherein the purge gas is hydrogen.

14. The system according to claim 9, wherein the purge gas is hydrogen.

15. The method according to claim 10, wherein the oxygen partial pressure is set to a value of more than $9 \times 10^{-6}$ mbar at the silicon-containing surface and/or at the optical surface.

* * * * *

UNITED STATES PATENT AND TRADEMARK OFFICE
CERTIFICATE OF CORRECTION

PATENT NO. : 10,073,361 B2
APPLICATION NO. : 15/483607
DATED : September 11, 2018
INVENTOR(S) : Dirk Heinrich Ehm et al.

It is certified that error appears in the above-identified patent and that said Letters Patent is hereby corrected as shown below:

In the Specification

Column 11, Line 8, delete "pot" and insert -- $p_{O2}$ --, therefor.

Column 11, Line 41, delete "pot" and insert -- $p_{O2}$ --, therefor.

Signed and Sealed this
Eleventh Day of August, 2020

Andrei Iancu
*Director of the United States Patent and Trademark Office*